(12) United States Patent
Noda et al.

(10) Patent No.: US 12,087,651 B2
(45) Date of Patent: Sep. 10, 2024

(54) SEMICONDUCTOR DEVICE AND METHOD OF MANUFACTURING THE SAME

(71) Applicant: Mitsubishi Electric Corporation, Tokyo (JP)

(72) Inventors: Kazuma Noda, Tokyo (JP); Satoshi Kondo, Tokyo (JP); Junji Fujino, Tokyo (JP); Michio Ogawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 369 days.

(21) Appl. No.: 17/455,812

(22) Filed: Nov. 19, 2021

(65) Prior Publication Data

US 2022/0270941 A1 Aug. 25, 2022

(30) Foreign Application Priority Data

Feb. 24, 2021 (JP) .................................. 2021-027398

(51) Int. Cl.
*H01L 23/24* (2006.01)
*H01L 23/31* (2006.01)
(Continued)

(52) U.S. Cl.
CPC .......... *H01L 23/24* (2013.01); *H01L 23/3121* (2013.01); *H01L 23/495* (2013.01);
(Continued)

(58) Field of Classification Search
CPC ... H01L 23/24; H01L 23/3121; H01L 23/495; H01L 23/498; H01L 24/32; H01L 24/33; H01L 25/072; H01L 25/18; H01L 2224/32157; H01L 2224/32245; H01L 2224/33181; H01L 24/29; H01L 24/83; H01L 23/16; H01L 25/50; H01L 2224/27334; H01L 2224/291; H01L 2224/29294; H01L 2224/293; H01L 2224/32227; H01L 2224/83191; H01L 2224/83192; H01L 2224/83203; H01L 2224/83815; H01L 21/56; H01L 23/057; H01L 23/3735; H01L 23/49; H01L 21/54
(Continued)

(56) References Cited

U.S. PATENT DOCUMENTS 5,420,752 A * 5/1995 Variot .................. H01L 21/565
174/548
9,607,940 B2 * 3/2017 Yato ...................... H01L 23/13
(Continued)

FOREIGN PATENT DOCUMENTS

WO WO-2019194272 A1 * 10/2019 ......... E05B 19/0017

*Primary Examiner* — Victor A Mandala
(74) *Attorney, Agent, or Firm* — Studebaker & Brackett PC

(57) ABSTRACT

An object is to provide a technique capable of suppressing an occurrence of a non-filled portion. A semiconductor device includes a base plate, a case, and a semiconductor element. The semiconductor element is disposed in a space of the base plate and the case. The semiconductor device includes a lead electrode. The lead electrode is connected to an upper surface of the semiconductor element in the space. The semiconductor device includes a raised portion. The raised portion is disposed on an upper surface of the lead electrode in the space. The semiconductor device includes a sealing resin. The sealing resin seals the semiconductor element and the lead electrode in the space.

7 Claims, 3 Drawing Sheets

(51) Int. Cl.
  *H01L 23/495* (2006.01)
  *H01L 23/00* (2006.01)
  *H01L 23/498* (2006.01)
  *H01L 25/07* (2006.01)
  *H01L 25/18* (2023.01)

(52) U.S. Cl.
  CPC ............ *H01L 23/498* (2013.01); *H01L 24/32* (2013.01); *H01L 24/33* (2013.01); *H01L 25/072* (2013.01); *H01L 25/18* (2013.01); *H01L 2224/32157* (2013.01); *H01L 2224/32245* (2013.01); *H01L 2224/33181* (2013.01)

(58) Field of Classification Search
  USPC ........................................................ 257/735
  See application file for complete search history.

(56) References Cited

U.S. PATENT DOCUMENTS

| | | | | |
|---|---|---|---|---|
| 11,615,967 B2* | 3/2023 | Lee | ................... | H01L 23/3735 |
| | | | | 361/728 |
| 2006/0012016 A1* | 1/2006 | Betz | ................... | H01L 24/97 |
| | | | | 257/E23.101 |
| 2011/0198739 A1* | 8/2011 | Amanai | ................. | H01L 21/268 |
| | | | | 257/667 |
| 2013/0161801 A1* | 6/2013 | Otremba | ........... | H01L 23/49562 |
| | | | | 361/813 |
| 2013/0168723 A1* | 7/2013 | Kasae | ..................... | H01L 33/62 |
| | | | | 362/382 |
| 2014/0339595 A1* | 11/2014 | Kobayakawa | ........ | H01L 33/486 |
| | | | | 257/99 |
| 2014/0374848 A1* | 12/2014 | Koh | ..................... | H01L 23/315 |
| | | | | 257/415 |
| 2019/0143434 A1* | 5/2019 | Yoneda | ............. | H01L 23/53214 |
| | | | | 257/741 |
| 2020/0205292 A1* | 6/2020 | Inoue | ...................... | H01L 23/24 |
| 2021/0257269 A1* | 8/2021 | Taniguchi | ........... | H01L 23/3121 |
| 2022/0189836 A1* | 6/2022 | Morrison | ............ | H01L 23/3185 |
| 2022/0336402 A1* | 10/2022 | Hitomi | .................... | H01L 24/45 |

* cited by examiner

SEMICONDUCTOR DEVICE AND METHOD OF MANUFACTURING THE SAME

BACKGROUND OF THE INVENTION

Field of the Invention

The present disclosure relates to a semiconductor device and a method of manufacturing the same.

Description of the Background Art

Proposed is a semiconductor device including a substrate, a semiconductor element disposed on the substrate, a lead electrode connected to an upper surface of the semiconductor element, and a sealing resin sealing the substrate, the semiconductor element, and the lead electrode in a space of a base plate and a case (for example, International Publication No. 2019/194272).

SUMMARY

Such a semiconductor device is manufactured by housing the substrate, the semiconductor element, and the lead electrode in the space, and subsequently injecting a fluent resin before hardened, which is to be a sealing resin, into the space. However, a gap between the lead electrode and the base plate is narrow, thus there is a problem that a non-filled portion which is not filled with the fluent resin in a part of the gap occurs and this non-filled portion reduces an electrical insulation property and reliability of the semiconductor device.

The present disclosure therefore has been made to solve the above problems, and it is an object of the present disclosure to provide a technique capable of suppressing an occurrence of the non-filled portion.

A semiconductor device according to the present disclosure includes: a base plate; a case surrounding a space on the base plate; a semiconductor element disposed in the space; a lead electrode connected to an upper surface of the semiconductor element in the space; a raised portion disposed on an upper surface of the lead electrode in the space; and a sealing resin sealing the semiconductor element and the lead electrode in the space.

An occurrence of the non-filled portion can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
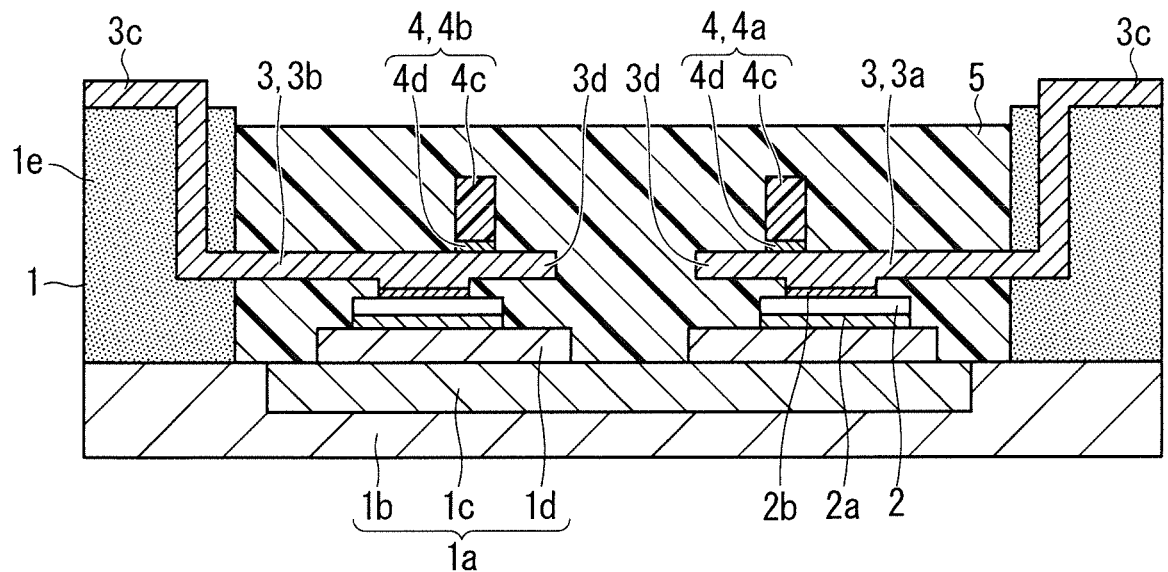
FIG. 1 is a cross-sectional view illustrating a configuration of a semiconductor device according to an embodiment 1.

Embodiments are described with reference to the appended drawings hereinafter. Features described in each embodiment described hereinafter is exemplification, thus all features are not necessarily applied. The same or similar reference numerals will be assigned to similar constituent elements in a plurality of embodiments in the description hereinafter, and the different constituent elements are mainly described hereinafter. A specific position and direction such as "upper side" or "lower side", for example, may not necessarily coincide with a direction in an actual implementation in the description hereinafter.

Embodiment 1

FIG. 1 is a cross-sectional view illustrating a configuration of a semiconductor device according to the present embodiment 1. The semiconductor device in FIG. 1 includes a base plate 1a, a case 1e, a semiconductor element 2, bonding materials 2a and 2b, a lead electrode 3, a raised portion 4, and a sealing resin 5.

The case 1e surrounds a space on the base plate 1a. In the description hereinafter, a space defined by the base plate 1a and the case 1e is referred to as "the case space".

The base plate 1a includes a heat radiation plate 1b made of metal such as aluminum alloy and copper, for example, an insulating substrate 1c made of ceramic such as aluminum nitride and silicon nitride and resin, for example, and a metal pattern 1d made of metal such as aluminum alloy and copper, for example. The heat radiation plate 1b functions as a heat radiator.

The case 1e is made up of resin such as polyphenylene sulfide (PPS), for example. The case 1e is bonded to a peripheral edge part of the base plate 1a by silicone resin, for example.

The semiconductor element 2 is disposed in the case space. The semiconductor element 2 may be a semiconductor switching element such as an insulated gate bipolar transistor (IGBT), a reverse conducting IGBT, and a metal oxide semiconductor field effect transistor (MOSFET), or may be a diode such as a PN junction diode (PND) and a Schottky barrier diode (SBD). A material of the semiconductor element 2 may be silicon (Si) or may be a wide bandgap semiconductor such as silicon carbide (SiC), gallium nitride (GaN), or diamond having a larger bandgap than silicon. When the semiconductor element 2 is made up of a wide bandgap semiconductor, a stable operation under high temperature and high voltage and increase in switching speed can be achieved.

In the example in FIG. 1, each of the two semiconductor elements 2 is bonded on the metal pattern 1d by the bonding material 2a. The number of semiconductor elements 2 is not limited to two, but is changed as usage. A material of the bonding material 2a is determined in consideration of an operation temperature of the semiconductor device, and is generally solder.

The lead electrode 3 is made of metal, for example, and connected to an upper surface of the semiconductor element 2 in the case space. As described above, not a metal wire bond but the lead electrode 3 connects the semiconductor element 2 and an outer electrode, and is used for a route of main current, thus a high current density and high reliability can be achieved.

In the present embodiment 1, the lead electrode 3 includes a first lead electrode 3a and a second lead electrode 3b separated from each other. In the example in FIG. 1, the first lead electrode 3a is bonded to an upper surface of one semiconductor element 2 by the bonding material 2b, and the second lead electrode 3b is bonded to an upper surface of the other semiconductor element 2 by the bonding material 2b. A material of the bonding material 2b is determined in consideration of an operation temperature of the semiconductor device, and is generally solder.

When the first lead electrode 3a and the second lead electrode 3b are not distinguished from each other, they are referred to as the lead electrode 3 in the description hereinafter. The number of lead electrodes 3 is not limited to two, but is changed as usage.

The lead electrode 3 includes an end portion 3c and an end portion 3d. The end portion 3c on the same side as the case 1e is directly fixed to the case 1e. The end portion 3d opposite to a sidewall of the case 1e is indirectly fixed to the case 1e. In the example in FIG. 1, an area of an upper surface of the lead electrode 3 is larger than an area of a side surface of the lead electrode 3.

The raised portion 4 is disposed on the upper surface of the lead electrode 3 in the case space, and protrudes to an upper side from the upper surface of the lead electrode 3. In the present embodiment 1, the raised portion 4 includes a first raised portion 4a disposed on an upper surface of the first lead electrode 3a on the second lead electrode 3b side and a second raised portion 4b disposed on an upper surface of the second lead electrode 3b on the first lead electrode 3a side.

When the first raised portion 4a and the second raised portion 4b are not distinguished from each other, they are referred to as the raised portion 4 in the description hereinafter. The number of raised portions 4 is not limited to two, that is to say, the number of each of the first raised portions 4a and the second raised potions 4b is not limited to one, but is changed as usage.

The raised portion 4 includes a resin hardened material 4c and an adhesive material 4d attaching the resin hardened material 4c to the lead electrode 3. Any shape is applicable as a shape of the resin hardened material 4c as long as flowage of a fluent resin described hereinafter can be controlled, thus a rectangular shape or an arc-like shape is also applicable. A height of the resin hardened material 4c may be substantially equal to or smaller than 10 mm, for example.

The sealing resin 5 is made of epoxy, for example, and seals the semiconductor element 2 and the lead electrode 3 in the case space. The sealing resin 5 protects the insulating substrate 1c, the semiconductor element 2, and the lead electrode 3 from an external environment.

Manufacturing Method

Next, a method of manufacturing the semiconductor device in FIG. 1 is described in sequence from a first procedure to a fifth procedure separately.

First Procedure

The base plate 1a and the semiconductor element 2 are bonded by the bonding material 2a. A plate solder, for example, as the bonding material 2a is placed on the metal pattern 1d, and the plate solder is heated to a melting point thereof, thereby performing soldering of bonding the semiconductor element 2 to the base plate 1a. A paste solder, for example, as the bonding material 2a is printed on the metal pattern 1d, and the paste solder is heated to a melting point thereof, thereby performing soldering of bonding the semiconductor element 2 to the base plate 1a.

Second Procedure

The case 1e integrated with the lead electrode 3 is bonded to the base plate 1a to form the case space. In parallel with this, for example, a plate solder or a solder paste is previously placed on the semiconductor element 2 as the bonding material 2b, and a silicone-series or epoxy-series adhesive material not shown in the drawings is previously applied to a joint surface between a lower portion of the case 1e and the heat radiation plate 1b.

In this state, a load is applied from one side of the base plate 1a and the case 1e toward the other side, thus the lower portion of the case 1e and the heat radiation plate 1b are firmly attached to each other to make the lead electrode 3 and the bonding material 2b have contact with each other. Subsequently, a hardening heat treatment is performed to harden the adhesive material between the lower portion of the case 1e and the heat radiation plate 1b. A tapping screw not shown in the drawing for screwing the case 1e and the heat radiation plate 1b may be used in place of the adhesive material.

Third Procedure

The semiconductor element 2 and the lead electrode 3 are bonded by the bonding material 2b. Heating for bonding by the bonding material 2b may be performed simultaneously with the hardening of the adhesive material in the second procedure.

Fourth Procedure

The adhesive material 4d is applied to a part of the upper surface of the lead electrode 3 and the resin hardened material 4c is disposed on the adhesive material 4d to provide the raised portion 4 having a necessary shape on the upper surface of the lead electrode 3. Used for resin of the resin hardened material 4c is resin having a desired elastic modulus (for example, substantially 9 to 13 GPa), a desired heat resistance (for example, substantially 200° C. at a maximum), and a linear expansion coefficient equal to that of the sealing resin 5.

Fifth Procedure

Figure 2:
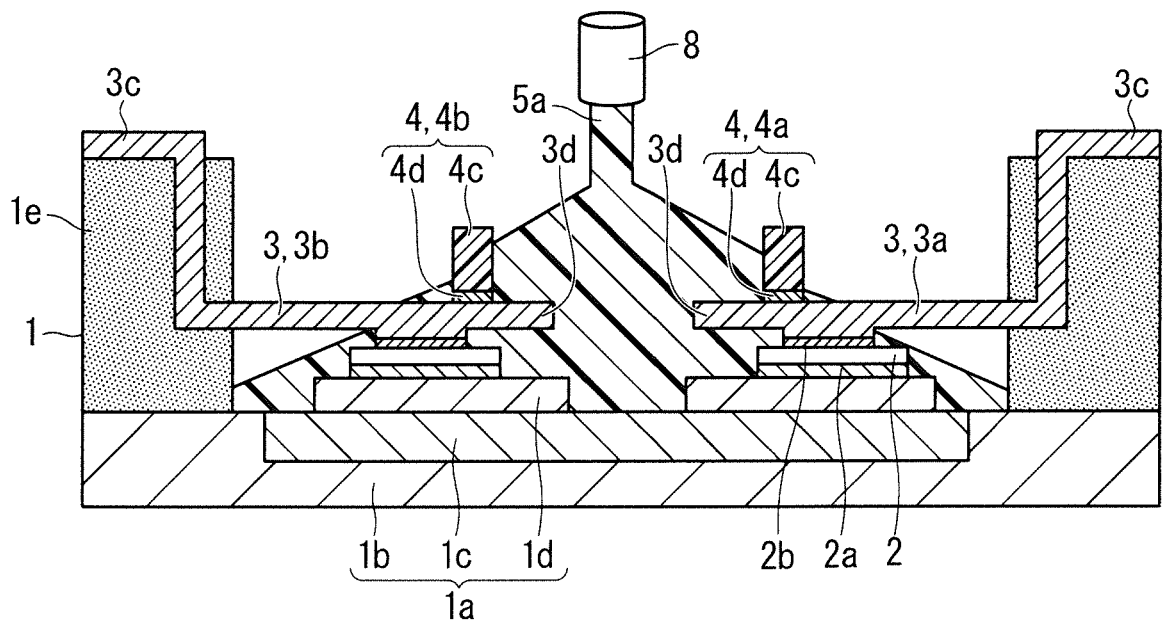
FIG. 2 is a cross-sectional view for describing a method of manufacturing the semiconductor device according to the embodiment 1.

As illustrated in FIG. 2, a nozzle 8 of a sealing resin injection machine is disposed above the end portion 3d side of the raised portion 4. In the configuration assembled in the first to fourth procedures, a liquid fluent resin 5a which is to be the sealing resin 5 is discharged from the nozzle 8 to be injected into the case space. Accordingly, the semiconductor element 2 and the lead electrode 3 are sealed by the fluent resin 5a.

For example, silicone gel or epoxy resin is used for the sealing resin 5 and the fluent resin 5a, however, the material thereof is not limited thereto. Any resin is applicable as long as it has a physical property such as a desired elastic modulus (for example, substantially 0.1 to 10 MPa in silicone gel, and substantially 9 to 13 GPa in epoxy resin), a desired heat resistance (for example, substantially 200° C. at a maximum), an adhesion property, and a desired linear expansion coefficient. The case space may be depressurized when the fluent resin 5a is injected into the case space.

The injected fluent resin 5a is hardened in a hardening furnace, for example, to be the sealing resin 5, and the semiconductor device in FIG. 1 is completed. An inspection such as necessary electrical characteristics is performed on the completed semiconductor device.

Action in Embodiment 1

Figure 3:
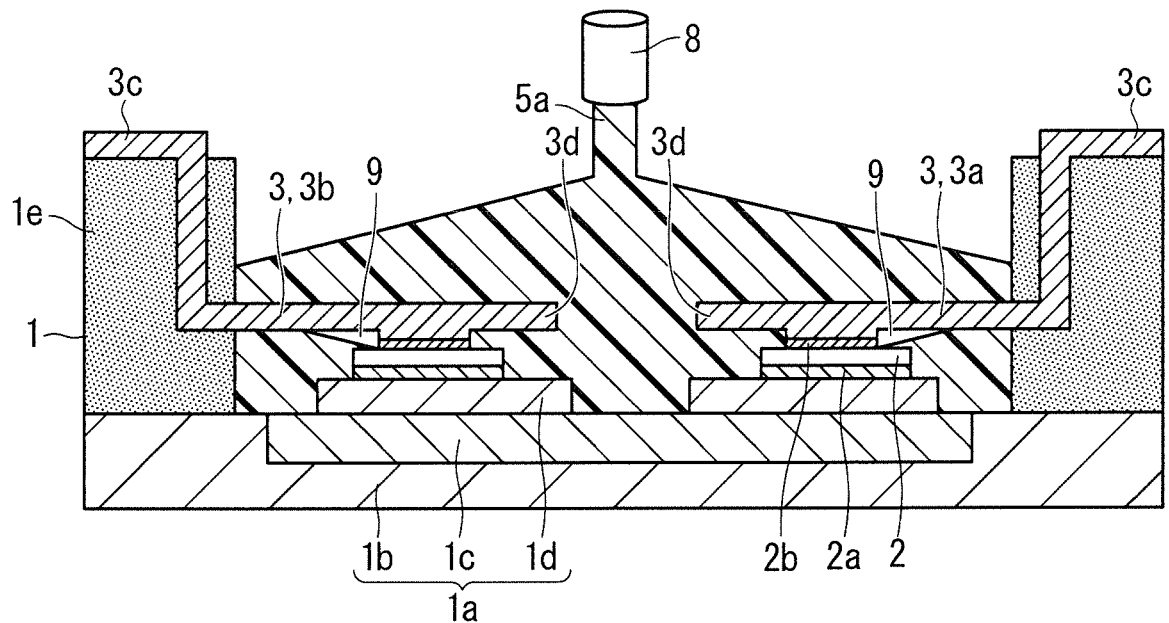
FIG. 3 is a cross-sectional view for describing a method of manufacturing a related semiconductor device.

Described is a semiconductor device relating to the semiconductor device according to the present embodiment 1 (referred to "the related semiconductor device" hereinafter) before an action in the present embodiment 1 is described. FIG. 3 is a cross-sectional view for describing a method of manufacturing a related semiconductor device. The raised portion 4 is not disposed in the related semiconductor device.

As illustrated in FIG. 3, in the configuration in which the lead electrode 3 is connected to the upper surface of the semiconductor element 2, a gap between the lead electrode 3 and the insulating substrate 1c or between the lead electrode 3 and the semiconductor element 2 (referred to as "the gap on the lower portion of the electrode" hereinafter) is narrow. Thus, in the fifth procedure in which the fluent resin 5a is injected, the upper surface of the lead electrode 3 is covered by the fluent resin 5a in many cases before the gap on the lower portion of the electrode is filled with the fluent resin 5a.

When the fluent resin 5a flowing on the upper surface of the lead electrode 3 and the fluent resin 5a flowing in the gap on the lower portion of the electrode meet each other, a non-filled portion 9 which is not filled with the fluent resin 5a occurs easily near a meeting point of the fluent resin 5a in the gap on the lower portion of the electrode. Thus, there is a problem that the non-filled portion 9 reduces an electrical insulation property and reliability in the related semiconductor device.

In contrast, according to the present embodiment 1, the raised portion 4 is disposed on the upper surface of the lead electrode 3, thus the raised portion 4 blocks the flow of the fluent resin 5a flowing on the upper surface of the lead electrode 3. Accordingly, the flow of the fluent resin 5a in the gap on the lower portion of the electrode is relatively promoted, and the fluent resin 5a fills the space around the lead electrode 3 in order from a lower portion to an upper portion of the lead electrode 3. As a result, the occurrence of the non-filled portion 9 in the gap on the lower portion of the electrode can be suppressed, and reduction in an electrical insulation property and reliability of the semiconductor device caused by the non-filled portion 9 can be suppressed. This configuration is established also in a case where viscosity of the fluent resin 5a is substantially 100 Pa·s, for example, that is relatively large.

According to the present embodiment 1, the raised portion 4 includes a resin hardened material. According to such a configuration, the raised portion 4 can be made up of a general-purpose material. A shape, a height, and a size of the raised portion 4 can be easily changed, thus the shape, the height, and the size of the raised portion 4 can be appropriately set in accordance with a shape and a size of the semiconductor device and a nozzle position and an injection speed of the fluent resin 5a.

The configuration of the raised portion 4 is not limited thereto, but a ribbon-shaped metal wire, a metal body, or a part of the lead electrode 3, for example, is also applicable as the raised portion 4. When the part of the lead electrode 3 is used for the raised portion 4, the number of components can be reduced.

In the present embodiment 1, the first raised portion 4a is disposed on the upper surface of the first lead electrode 3a on the second lead electrode 3b side and the second raised portion 4b is disposed on the upper surface of the second lead electrode 3b on the first lead electrode 3a side. According to such a configuration, the fluent resin 5a is guided to the space between the first lead electrode 3a and the second lead electrode 3b by the first raised portion 4a and the second raised portion 4b, thus the flow of the fluent resin 5a in the gap on the lower portion of the electrode can be promoted. As a result, the occurrence of the non-filled portion 9 in the gap on the lower portion of the electrode can be suppressed.

Embodiment 2

Figure 4:
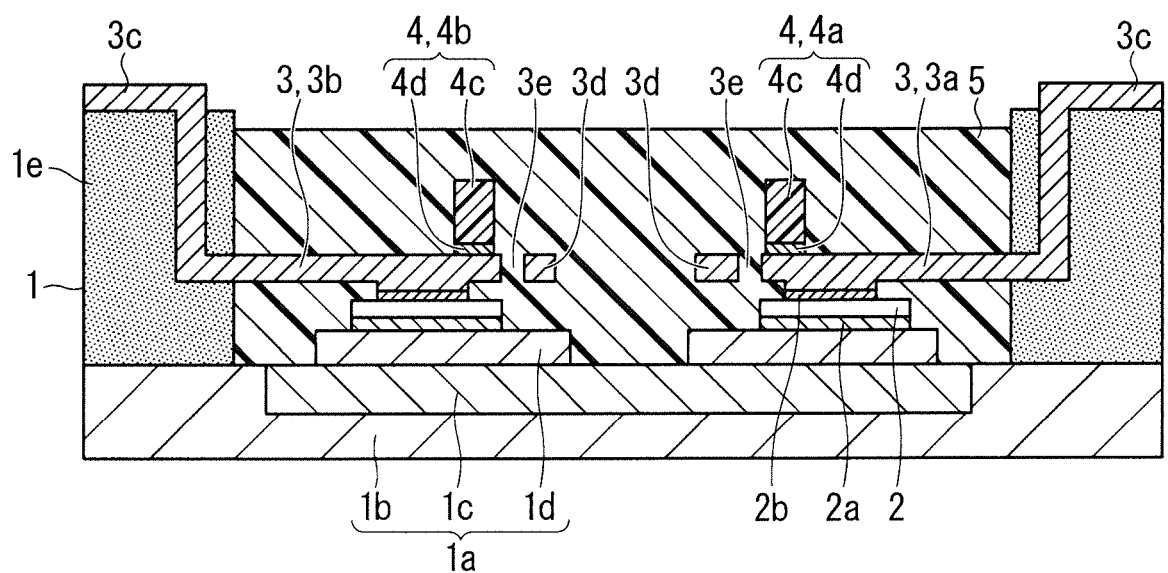
FIG. 4 is a cross-sectional view illustrating a configuration of a semiconductor device according to an embodiment 2.

FIG. 4 is a cross-sectional view illustrating a configuration of a semiconductor device according to the present embodiment 2. A configuration in the present embodiment 2 is similar to that in the embodiment 1 except that a through hole 3e located adjacent to the raised portion 4 in a plan view is disposed in the lead electrode 3. The state where the through hole 3e is adjacent to the raised portion 4 in a plan view indicates a state where the through hole 3e has contact with the raised portion 4 in a plan view or a state where the through hole 3e is located within a range from the raised portion 4 to substantially a height of the raised portion 4 in a plan view.

A shape of the through hole 3e is not particularly limited, but a circular shape, a rectangular shape, or the other polygonal shape, for example, is also applicable. The number of through holes 3e disposed for one raised portion 4 may be one, or a plurality of through holes 3e may also be disposed. As with the example in FIG. 4, the through hole 3e is disposed between the end portion 3d and a portion where the raised portion 4 is provided in the lead electrode 3, that is to say, a near side of the lead electrode 3 in a flowage direction of the fluent resin 5a in relation to the raised portion 4.

Action in Embodiment 2

Also in the present embodiment 2, the raised portion 4 is disposed on the upper surface of the lead electrode 3 as with the embodiment 1, the raised portion 4 can block the flow of the fluent resin 5a flowing on the upper surface of the lead electrode 3, and the flow of the fluent resin 5a in the gap on the lower portion of the electrode can be promoted. As a result, the occurrence of the non-filled portion 9 in the gap on the lower portion of the electrode can be further suppressed.

According to the present embodiment 2, the through hole 3e located adjacent to the raised portion 4 is disposed in the lead electrode 3 in a plan view. According to such a configuration, the through hole 3e blocks the flow the fluent resin 5a flowing on the upper surface of the lead electrode 3 when the fluent resin 5a is injected. The fluent resin 5a flowing on the upper surface of the lead electrode 3 is guided to the gap on the lower portion of the electrode by the through hole 3e, thus the flow of the fluent resin 5a in the gap on the lower portion of the electrode can be further promoted compared with the case in the embodiment 1. As a result, the occurrence of the non-filled portion 9 in the gap on the lower portion of the electrode can be further suppressed.

According to the configuration that the through hole 3e is disposed between the end portion 3d and a portion where the raised portion 4 is provided in the lead electrode 3 as illustrated in FIG. 4, the fluent resin 5a is guided to the through hole 3e by the raised portion 4. Thus, the flow of the fluent resin 5a in the gap on the lower portion of the electrode can be further promoted, and the occurrence of the non-filled portion 9 in the gap on the lower portion of the electrode can be further suppressed.

Embodiment 3

Figure 5:
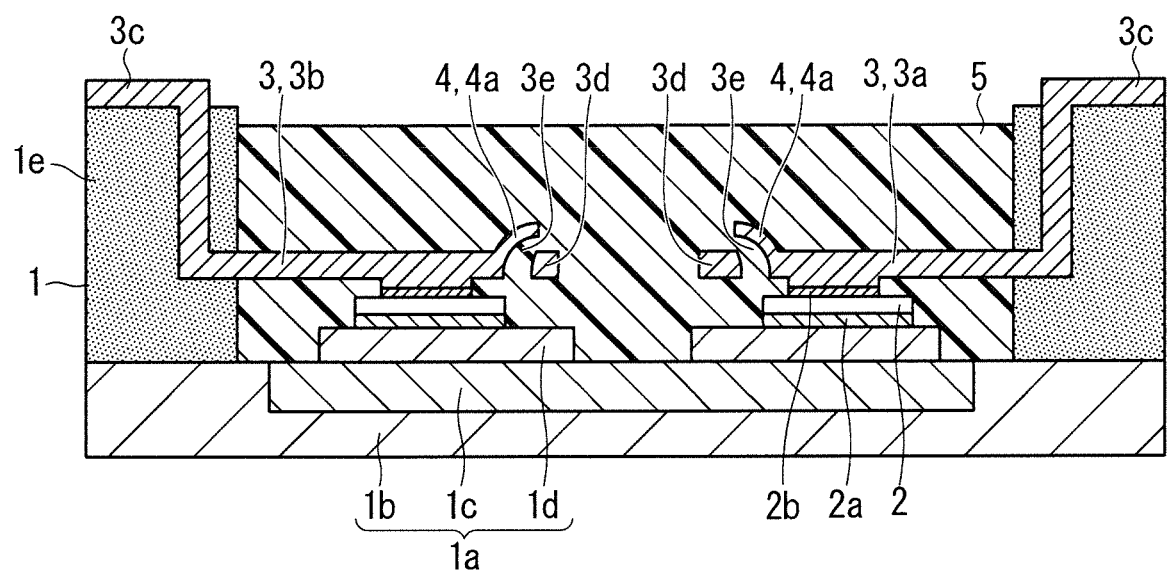
FIG. 5 is a cross-sectional view illustrating a configuration of a semiconductor device according to an embodiment 3.

FIG. 5 is a cross-sectional view illustrating a configuration of a semiconductor device according to the present embodiment 3. In the present embodiment 3, the raised portion 4 constitutes a part of the lead electrode 3. The raised portion 4 is inclined upward toward the end portion 3d, and an opening of the through hole 3e is directed to the nozzle 8. In the example in FIG. 5, the cross-sectional shape of the raised portion 4 has an arc-like shape, however, the shape thereof is not limited thereto. The raised portion 4 and the opening of the through hole 3e illustrated in FIG. 5 can be formed by a press work, for example, inexpensively. According to the present embodiment 3 having such a configuration, the resin hardened material 4c and the adhesive material 4d described in the embodiment 1 are unnecessary, thus cost can be reduced.

A configuration in the present embodiment 3 is similar to that in the embodiment 2 except for the above point.

Action in Embodiment 3

Also in the present embodiment 3, the raised portion 4 is disposed on the upper surface of the lead electrode 3 as with the embodiments 1 and 2, the raised portion 4 can block the flow of the fluent resin 5a flowing on the upper surface of the lead electrode 3, and the flow of the fluent resin 5a in the gap on the lower portion of the electrode can be promoted. As a result, the occurrence of the non-filled portion 9 in the gap on the lower portion of the electrode can be further suppressed.

According to the present embodiment 3, the raised portion 4 is inclined upward toward the end portion 3d. According to such a configuration, even when the precedent fluent resin 5a is pushed by the subsequent fluent resin 5a on the upper surface of the lead electrode 3, an extension of the precedent fluent resin 5a beyond the raised portion 4 can be suppressed. Thus, the fluent resin 5a is efficiently guided to the through hole 3e by the raised portion 4, thus the flow of the fluent resin 5a in the gap on the lower portion of the electrode can be further promoted, and the occurrence of the non-filled portion 9 in the gap on the lower portion of the electrode can be further suppressed.

The raised portion 4 inclined as with the present embodiment 3 may be applied to the embodiment 1 instead of the embodiment 2.

Each embodiment and each modification example can be arbitrarily combined, or each embodiment and each modification can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a base plate;
a case surrounding a space on the base plate;
a semiconductor element disposed in the space;
a lead electrode connected to an upper surface of the semiconductor element in the space;
a raised portion disposed on an upper surface of the lead electrode in the space to protrude away from the upper surface of the lead electrode to a distal end positioned directly over the upper surface of the lead electrode; and
a sealing resin sealing the semiconductor element and the lead electrode in the space, wherein
the distal end of the raised portion is covered with the sealing resin.

2. The semiconductor device according to claim 1, wherein
the lead electrode includes an end portion opposite to a sidewall of the case, and
the raised portion protrudes away from the upper surface at an inclination relative to the upper surface and toward the end portion.

3. The semiconductor device according to claim 1, wherein
the lead electrode includes a first lead electrode and a second lead electrode separated from each other, and
the raised portion includes:
a first raised portion disposed on an upper surface of the first lead electrode on the second lead electrode side; and
a second raised portion disposed on an upper surface of the second lead electrode on the first lead electrode side.

4. A method of manufacturing the semiconductor device according to claim 1, wherein
the lead electrode includes an end portion opposite to a sidewall of the case, and
a fluent resin which is to be the sealing resin is injected into the space from above the end portion side of the raised portion.

5. A semiconductor device, comprising:
a base plate;
a case surrounding a space on the base plate;
a semiconductor element disposed in the space;
a lead electrode connected to an upper surface of the semiconductor element in the space;
a raised portion disposed on an upper surface of the lead electrode in the space; and
a sealing resin sealing the semiconductor element and the lead electrode in the space, wherein
the raised portion includes a resin hardened material.

6. A semiconductor device, comprising:
a base plate;
a case surrounding a space on the base plate;
a semiconductor element disposed in the space;
a lead electrode connected to an upper surface of the semiconductor element in the space;
a raised portion disposed on an upper surface of the lead electrode in the space; and
a sealing resin sealing the semiconductor element and the lead electrode in the space, wherein
a through hole located adjacent to the raised portion in a plan view is disposed in the lead electrode.

7. The semiconductor device according to claim 6, wherein
the lead electrode includes an end portion opposite to a sidewall of the case, and
the through hole is disposed between the end portion and a portion where the raised portion is provided in the lead electrode.

* * * * *